US006807239B2

(12) United States Patent
Sugimoto et al.

(10) Patent No.: US 6,807,239 B2
(45) Date of Patent: Oct. 19, 2004

(54) SOFT-IN SOFT-OUT DECODER USED FOR AN ITERATIVE ERROR CORRECTION DECODER

(75) Inventors: Hiroki Sugimoto, Singapore (SG); Tingwu Wang, Singapore (SG); Kai Ren Tan, Singapore (SG); Ping Xie, Singapore (SG)

(73) Assignee: Oki Techno Centre (Singapore) PTE Ltd., Singapore (SG)

( * ) Notice: Subject to any disclaimer, the term of this patent is extended or adjusted under 35 U.S.C. 154(b) by 595 days.

(21) Appl. No.: 09/941,388

(22) Filed: Aug. 28, 2001

(65) Prior Publication Data

US 2002/0046378 A1 Apr. 18, 2002

(30) Foreign Application Priority Data

Aug. 29, 2000 (SG) .......................... 200004938

(51) Int. Cl.[7] .............. H03D 1/00; H04L 1/00
(52) U.S. Cl. .................. 375/341; 375/262; 714/746; 714/794
(58) Field of Search ................. 375/341, 262; 714/746, 794, 795

(56) References Cited

U.S. PATENT DOCUMENTS

2001/0054170 A1 * 12/2001 Chass et al. ............ 714/796

FOREIGN PATENT DOCUMENTS

EP         1030457        8/2000

OTHER PUBLICATIONS

"Performance of Turbo codes applied to W–CDMA" by Atsushi Fujiwara et al., Technical Report of IEICE, SST97–77, SANE97–102, (1997–12), pp. 19–24.
"Reduced complexity Symbol Detectors with Parallel Structures for LSI Channels" by Javan Erfanian, et al., IEEE Transactions on communications, vol. 42, No. 2/3/4, Feb./Mar./Apr. 1994, pp. 1661–1671.

* cited by examiner

Primary Examiner—Temesghen Ghebretinsae
(74) Attorney, Agent, or Firm—Ostrolenk, Faber, Gerb & Soffen, LLP

(57) ABSTRACT

Adders each add up an addition value sent from a metric calculator and a state metric read from a memory. A maximum value selector generates a first likelihood when a data bit is 1, based on the addition values added up by the adders. A maximum value selector generates a second likelihood when a data bit is 0, based on the addition values added up by the adders. A subtracter subtracts the second likelihood from the first likelihood to generate a likelihood ratio, and a subtracter subtracts data from the likelihood ratio and generates extrinsic information. A re-normalizer multiplies the extrinsic information by a predetermined value to re-normalize it and temporarily stores it in a memory. The extrinsic information stored in the memory is used as the prior probability information for the next iterative decoding.

10 Claims, 17 Drawing Sheets

US 6,807,239 B2

SOFT-IN SOFT-OUT DECODER USED FOR AN ITERATIVE ERROR CORRECTION DECODER

BACKGROUND OF THE INVENTION

1. Field of the Invention

The present invention relates to a soft-in, soft-out decoder used in an iterative error correction decoder which uses extrinsic information (prior probability information) to iteratively decode two or more code sequences.

2. Description of the Background Art

As one of error correction coding, an iterative error correction decoding method, called turbo coding, is known. This coding method creates a non-interleaved data sequence and an interleaved data sequence from a data sequence to be coded and uses a parallel concatenated convolutional code (PCCC) to convolute each of these data sequences. For example, "Effect of Application of Turbo Coding to W-CDMA", by A. Fujiwara et al. (The Institute of Electronics, Information and Communication Engineers, Technical Report of TEICE, SST77-78, pp. 19–24 (December, 1997) contains an example of turbo encoder. In the decoding process of such turbo codes, two or more code sequences are sequentially and iteratively decoded. The use of the result of other decoding as the prior probability information allows the turbo coding to provide the high-performance error correction code that reaches very close to Shannon limits. During each decoding, SISO (Soft In Soft Out) decoding such as MAP (maximum a posteriori) decoding is used. In this case, extrinsic information (prior probability information) output from each decoder is stored in a memory for all data of each decode frame.

However, the problem with the turbo coding described above is that, though very high performance error correction is attained, the decoder becomes complex in configuration, requires a large amount of memory, and consumes much power. To solve this problem, the log MAP decoding which converts MAP decoding calculation to the equivalent logarithm calculation is proposed as a practical algorithm. In addition, sub-log MAP, a simplified version of log MAP, is proposed to reduce the log MAP calculation amount and the circuit size. On the other hand, SOVA (Soft Output Viterbi Algorithm), an improved version of the Viterbi algorithm, is proposed. However, the problem is that the performance of SOVA is lower than that of MAP decoding or log-MAP decoding.

The amount of memory for storing decoded prior probability information is proportional to the size of an encoded frame. This means that packet communication in which large-sized packets are transmitted requires a large amount of memory. CDMA (Code Division Multiple Access) communication, in which the dynamic range of the bit width of a signal demodulated by the demodulator is very wide, requires a still larger amount of memory. To prevent the memory amount from being increased, the bit width of this signal must be limited. However, the bit width smaller than a predetermined width degrades demodulation performance.

SUMMARY OF THE INVENTION

It is therefore an object of the present invention to provide an iterative error correction decoder which removes the drawback of the prior art and reduces the memory amount without degrading decoding performance.

To solve the problems described above, the decoder according to the present invention comprises a plurality of metric calculators each generating a forward state metric and a backward state metric of a predetermined state for each data bit of each encoded frame; an extrinsic information calculator generating extrinsic information based on the forward state metric and the backward state metric; and a memory in which the forward state metric and the backward state metric are stored, wherein each of the plurality of metric calculators comprises a first adder generating a branch metric when the data bit is 1, based on received data, coded data, and prior probability information, and adding the state metric, which is supplied from the memory, to the branch metric to generate an addition value; a second adder generating a branch metric when the data bit is 0, based on the received data, coded data, and prior probability information, and adding the state metric, which is supplied from the memory, to the branch metric to generate an addition value; and a first maximum value selector selecting the larger of the addition value generated by the first adder and the addition value generated by the second adder to generate the state metric, wherein the extrinsic information calculator comprises a second maximum value selector adding the state metric, supplied from the memory, to each addition value generated when the forward state metric or the backward state metric, whichever is generated later, is generated by the first adder of each of the plurality of metric calculators, and selecting a largest addition value to generate a likelihood when the data bit is 1; a third maximum value selector adding the state metric, supplied from the memory, to each addition value generated when the forward state metric or the backward state metric, whichever is generated later, is generated by the second adder of each of the plurality of metric calculators, and selecting a largest addition value to generate a likelihood when the data bit is 0; a first subtracter subtracting the likelihood generated by the third maximum value selector from the likelihood generated by the second maximum value selector to generate a likelihood ratio; a second subtracter subtracting the data and the prior probability information from the likelihood ratio generated by the first subtracter; and a re-normalizer multiplying the extrinsic information generated by the second subtracter by a re-normalization coefficient to normalize the extrinsic information, and wherein the memory temporarily stores therein the state metrics calculated by the plurality of metric calculators, reads the state metric of each state metric therefrom when the state metric of a next data bit is generated, outputs the state metric to the first adder and the second adder of a predetermined metric calculator and, at the same time, stores the forward state metric or the backward state metric which is generated by each of the plurality of metric calculators and whichever is generated earlier and outputs the state metric to the second maximum value selector and the third maximum value selector of the extrinsic information calculator.

In addition, the decoder according to the present invention comprises a plurality of metric calculators each generating a forward state metric and a backward state metric of a predetermined state for each data bit of each encoded frame; an extrinsic information calculator generating extrinsic information based on the forward state metric and the backward state metric; and a memory in which the forward state metric and the backward state metric are accumulated, wherein each of the plurality of metric calculators comprises a first adder generating a branch metric when the data bit is 1, based on received data, coded data, and prior probability information, and adding the state metric, which is supplied from the memory, to the branch metric to generate an addition value; a second adder generating a branch metric when the data bit is 0, based on the received data, coded data, and prior probability information, and adding the state metric, which is supplied from the memory, to the branch metric to generate an addition value; and a first maximum value selector selecting the larger of the addition value generated by the first adder and the addition value generated by the second adder to generate the state metric, wherein the extrinsic information calculator comprises: a second maximum value selector adding the state metric, supplied from the memory, to each addition value generated when the forward state metric or the backward state metric, whichever is generated later, is generated by the first adder of each of the plurality of metric calculators, and selecting a largest addition value to generate a likelihood when the data bit is 1; a third maximum value selector adding the state metric, supplied from the memory, to each addition value generated when the forward state metric or the backward state metric, whichever is generated later, is generated by the second adder of each of the plurality of metric calculators, and selecting a largest addition value to generate a likelihood when the data bit is 0; a first subtracter subtracting the likelihood generated by the third maximum value selector from the likelihood generated by the second maximum value selector to generate a likelihood ratio; a second subtracter subtracting the data and the prior probability information from the likelihood ratio generated by the first subtracter; a first re-normalizer multiplying the extrinsic information generated by the second subtracter by a re-normalization coefficient to normalize the extrinsic information, a word length limitation circuit limiting a number of bits of the extrinsic information normalized by the first re-normalizer while changing a bit extraction position according to the number of times iterative decoding is executed; a memory circuit accumulating therein the extrinsic information whose word length is limited by the word length limitation circuit; and a second re-normalizer multiplying the extrinsic information read from the memory circuit by another re-normalization coefficient to normalize the extrinsic information, and wherein the memory temporarily stores therein the state metrics calculated by the plurality of metric calculators, reads the state metric of each state metric therefrom when the state metric of a next data bit is generated, outputs the state metric to the first adder and the second adder of a predetermined metric calculator and, at the same time, stores the forward state metric or the backward state metric which is generated by each of the plurality of metric calculators and whichever is generated earlier and outputs the state metric to the second maximum value selector and the third maximum value selector of the extrinsic information calculator.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Referring to the attached drawings, some embodiments of an SISO (soft in soft out) decoder according to the present invention will be described in detail.

Figure 1:
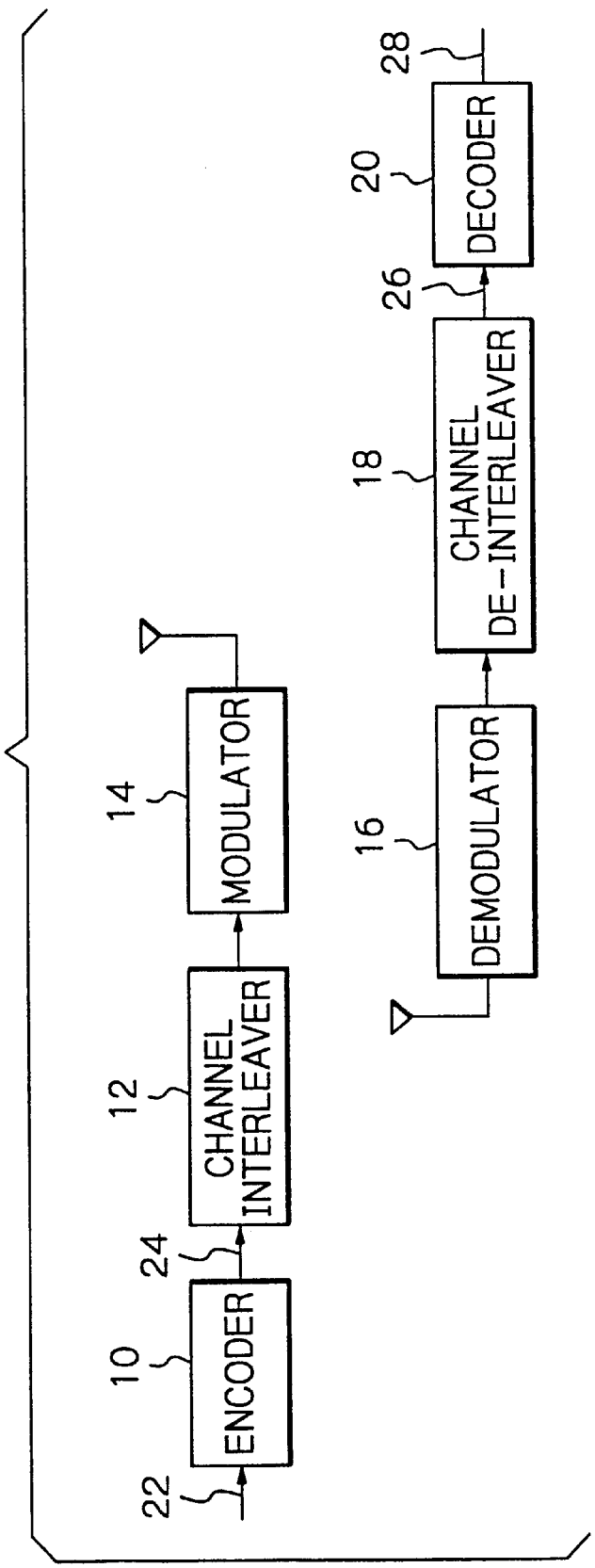
FIG. 1 is a schematic block diagram showing an example of a communication system in which an iterative error correction decoder including an SISO decoder according to the present invention is used.

FIG. 1 shows in a schematic block diagram an example of the configuration of a communication system using an iterative error correcting decoder 20 including an SISO decoder according to the present invention. In FIG. 1, the transmitting side encodes transmit data 22 with an iterative error correcting encoder 10 to generate coded data 24, interleaves the generated coded data 24 with a channel interleaver 12, and then modulates the interleaved data with a modulator 14 for transmission. The receiving side demodulates the received signal with a demodulator 16, de-interleaves the demodulated signal with a channel de-interleaver 18 to generate coded data 26, decodes the generated coded data 26 with the iterative error correcting decoder 20, and outputs receive data 28.

Figure 2:
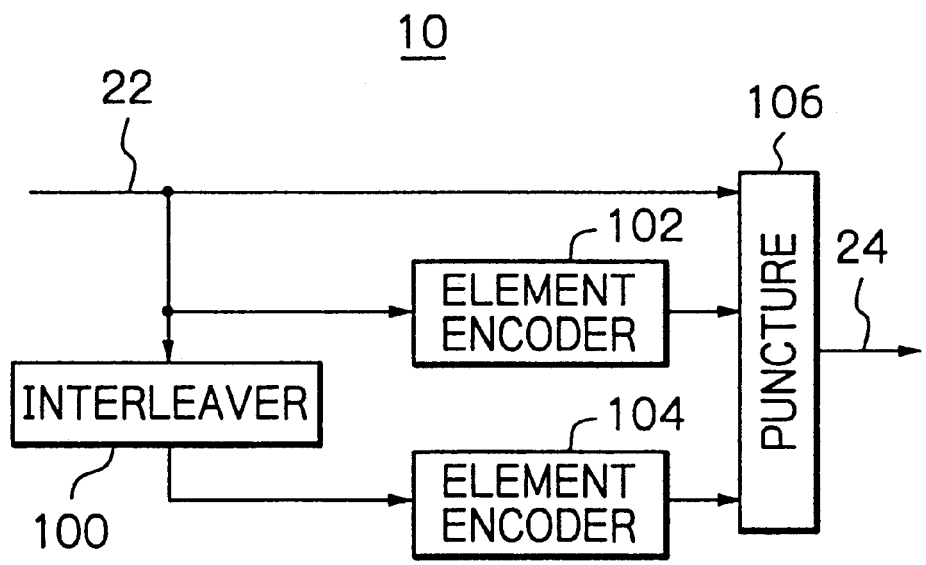
FIG. 2 is a block diagram showing an example of the iterative error correction encoder in FIG. 1.

To help understanding of the iterative error correcting decoder 20, the following describes the iterative error correcting encoder 10. FIG. 2 is a block diagram showing an example of the iterative error correcting encoder 10 generating PCCC (Parallel Concatenated Convolutional Code). In the description below, the same reference numerals represent like elements, and the reference numeral of a connection line represents the corresponding signal. This encoder 10 comprises an interleaver 100, element encoder 102 and a puncture 106. The transmit data 22 is input to the interleaver 100, element encoders 102, and puncture 106, respectively. The interleaver 100 interleaves the transmit data 22, one frame at a time, and outputs the interleaved data to the element encoder 104.

The element encoder 102 encodes the transmit data 22 and outputs the coded data to the puncture 106. The element encoder 104 encodes the data interleaved by the interleaver 100 and outputs the coded data to the puncture 106. The puncture 106 punctures the transmit data 22 and the coded data from the element encoders 102 and 104 according to the code rate and outputs punctured data as the coded data 24. Normally, the element encoders 102 and 104 generate recursive systematic convolutional code, but the present invention is not limited to this code.

Figure 3:
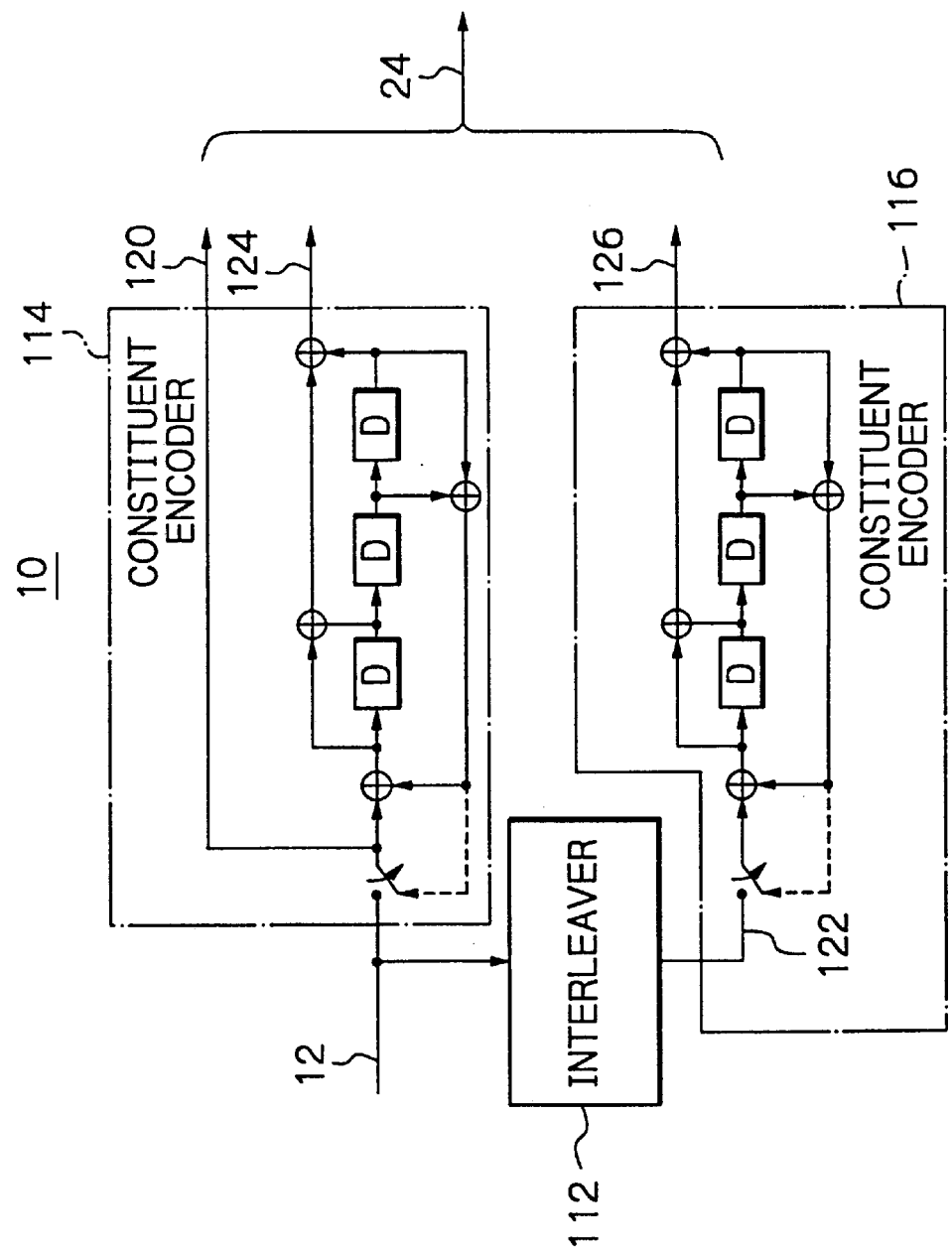
FIG. 3 is a block diagram showing another example of the iterative error correction encoder in FIG. 1.

FIG. 3 is a block diagram showing an example of the iterative error correcting encoder 10 used for WCDMA, one of CDMA (Code Division Multiple Access) technologies. This encoder 10 comprises an interleaver 112 and constituent encoders 114 and 116. The constituent encoder 114 outputs the received data 22 directly as data 120 and, at the same time, encodes the data 22 and outputs a recursive systematic convolutional code 124 of memory size 3. The constituent encoder 116 encodes the data 122 interleaved by the interleaver 112 and outputs a recursive systematic convolutional code 126 of memory size 3. The data 120 and the coded data 124 and 126 are output as the data 24. In this case, there is no need for puncture because the code rate is ⅓. Therefore, there is no element corresponding to the puncture 106 in FIG. 2.

Figure 4:
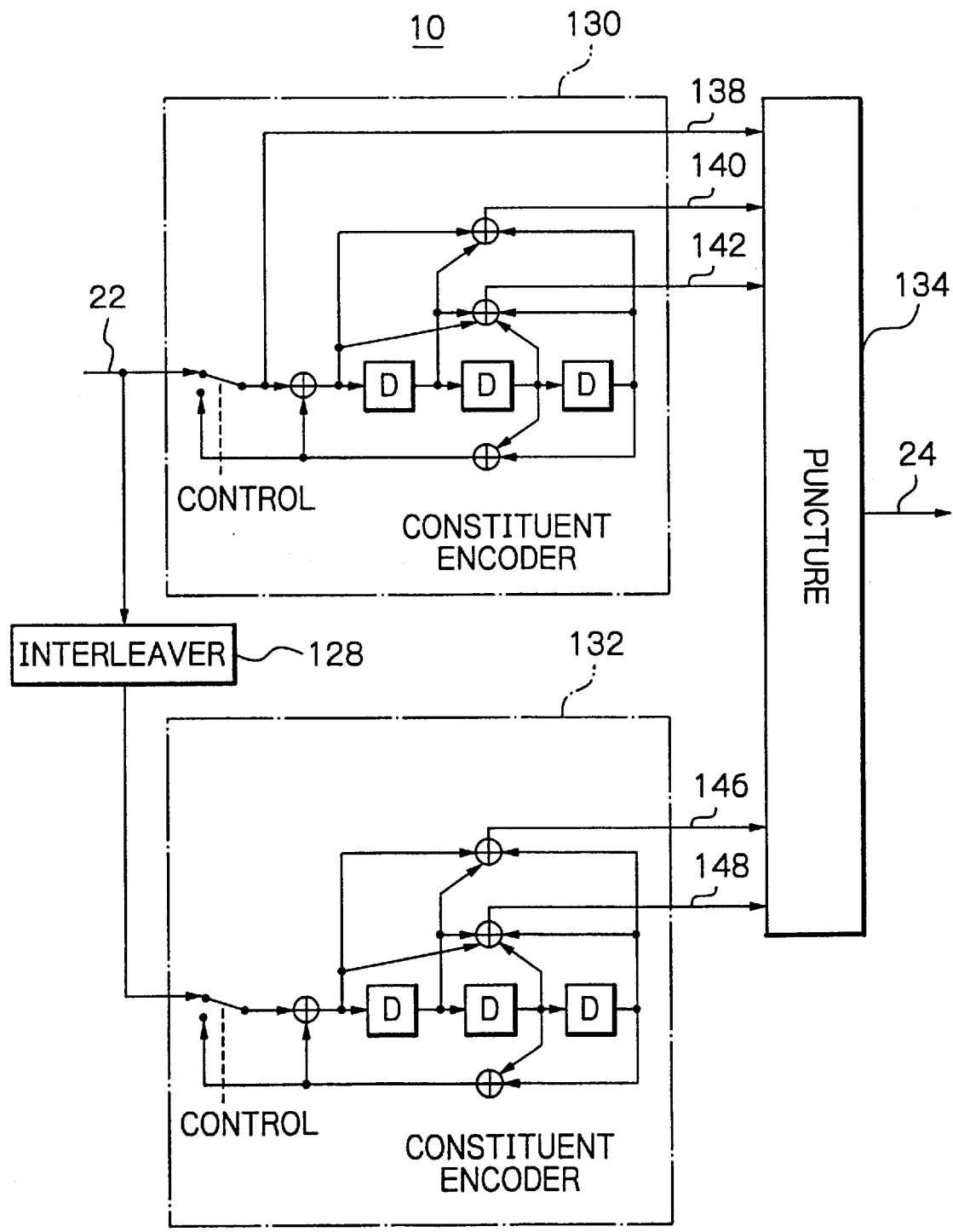
FIG. 4 is a block diagram showing still another example of the iterative error correction encoder in FIG. 1.

FIG. 4 is a block diagram showing an example of the iterative error correcting encoder 10 used for cdma2000, one of CDMA technologies. This encoder 10 comprises an interleaver 128, constituent encoders 130 and 132, and a puncture 134. The constituent encoder 130 generates recursive systematic convolutional codes 140 and 142 of memory size 3, and the constituent encoder 132 generates recursive systematic convolutional codes 146 and 148 of memory size 3. In this case, the recursive systematic convolutional codes 140 and 142 differ from the recursive systematic convolutional codes 146 and 148. The puncture 134 receives data 138 and the coded data 140 and 142 from the constituent encoder 130, and the coded data 146 and 48 from the constituent encoder 132. The puncture 134 punctures the data and outputs the data 24. In this case, the puncture 134 is able to achieve the minimum code rate of ⅕.

Figure 5:
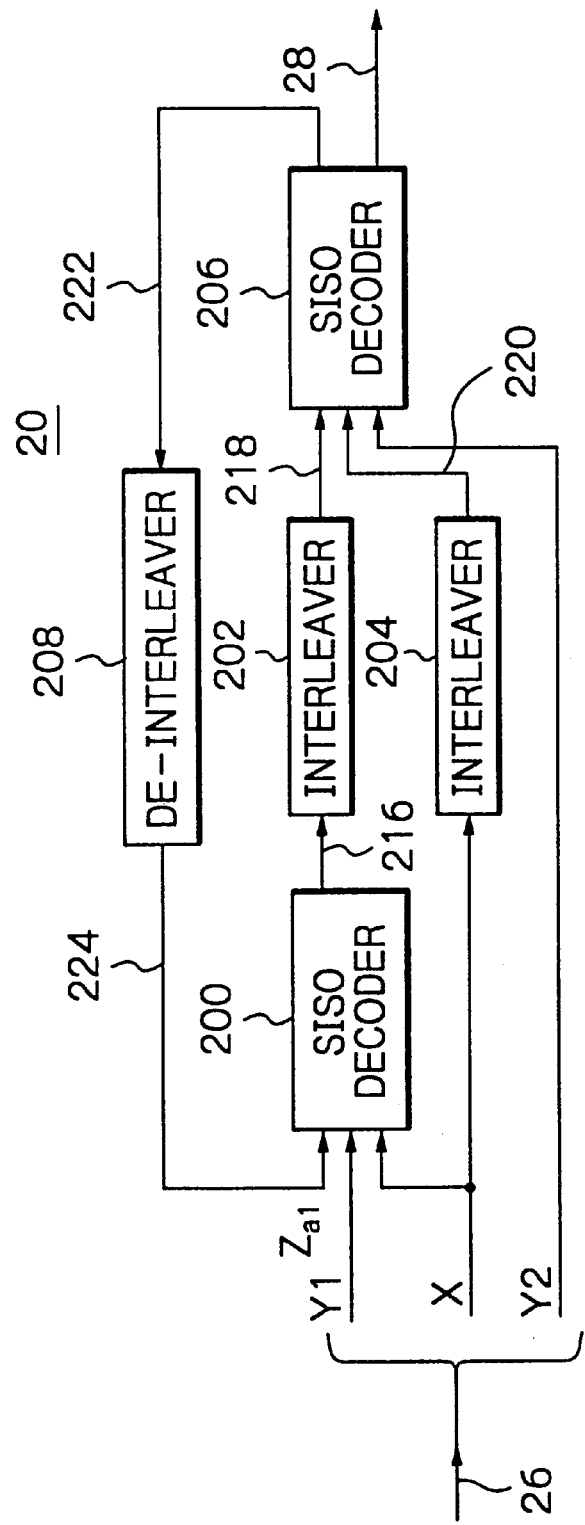
FIG. 5 shows an embodiment of the iterative error correction decoder in FIG. 1.

Next, an embodiment of the iterative error correcting decoder 20 which decodes the coded data, with the code rate of ⅓, sent from the iterative error correcting encoder 10 will be described. FIG. 5 is a block diagram showing the embodiment of the iterative error correcting decoder 20. This decoder 20 comprises two SISO decoders 200 and 206, two interleavers 202 and 204, and a de-interleaver 208. This decoder 20 decodes the data 26 demodulated by the demodulator 16 shown in FIG. 1 and interleaved by the channel de-interleaver 18. The data 26 is composed of data X and coded data Y1 and Y2 corresponding, respectively, to the data 120 and coded data 124 and 126 generated by the encoder 10 shown in FIG. 3.

The SISO decoder 200 generates soft-decision output data based on data X, coded data Y1, and prior probability information 224 output from the de-interleaver 208. It then outputs the generated soft-decision output data to the interleaver 202, connected to the output, as extrinsic information 216. The interleaver 202, similar in configuration to the interleaver 100 in FIG. 2, interleaves the extrinsic information 216 output from the SISO decoder 200 and outputs prior probability information 218 to the SISO decoder 206 connected to the output.

The SISO decoder 206, similar in configuration to the SISO decoder 200, generates soft-decision output data based on the received coded data Y2, the prior probability information 218 output from the interleaver 202, and the data 220 output from the interleaver 204 and outputs extrinsic information 222 to the de-interleaver 208. The de-interleaver 208 de-interleaves the extrinsic information 222 output from the SISO decoder 206 and outputs prior probability information 224 to the SISO decoder 200 connected to the output.

The operation of the iterative error correction decoder 20 with the configuration described above will be described. The data X and the coded data Y1 and Y2 are input to the decoder 20 in accordance with a predetermined bit sequence for each encoded frame. The SISO decoder 200 generates the extrinsic information 216 based on the data X, coded data Y1, and the prior probability information 224. In the initial stage when the extrinsic information 222 is yet not output from the SISO decoder 206, the value of 1 and the value of 0 are assigned, with equal probability, to the prior probability information 224 for all the bits of the data X.

The extrinsic information 216 output from the SISO decoder 200 is interleaved by the interleaver 202, and the resulting prior probability information 218 is input to the SISO decoder 206. On the other hand, the data X is interleaved by the interleaver 204, and the resulting data 220 is input to the SISO decoder 206. The SISO decoder 206 generates the extrinsic information 222 based on the received data Y2 and 220 and the prior probability information 218. The extrinsic information 222 output from the SISO decoder 206 is de-interleaved by the de-interleaver 208 and the resulting prior probability information 224 is input to the SISO decoder 200.

The iterative error correcting decoder 20 iteratively executes decoding described above with the use of the SISO decoders 200 and 206 to perform iterative error correction decoding. At the end of the iteration, the decoder 20 calculates the likelihood ratio of 1 or 0 and gives a decoding result 28.

The SISO decoders 200 and 206 described above will be described more in detail. As one of SISO decoders, a sub-log MAP decoder using sub-log MAP is known. This sub-log MAP is a simplified version of log MAP, which is created by converting the MAP (the maximum a posteriori) to a logarithmic equivalent. More specifically, the calculation is simpler than that of log MAP, because the summation by logarithmic calculation is replaced by the selection of the maximum value (or minimum value). Log MAP is disclosed in detail in "Reduced Complexity Symbol Detectors with Parallel Structures for ISI Channels", by J. Erfanian, S. Pasupathy, and G. Gulak, IEEE Trans. Commun. Vol. 42, pp. 1661–1671, February/March/April, 1994.

Figure 6:
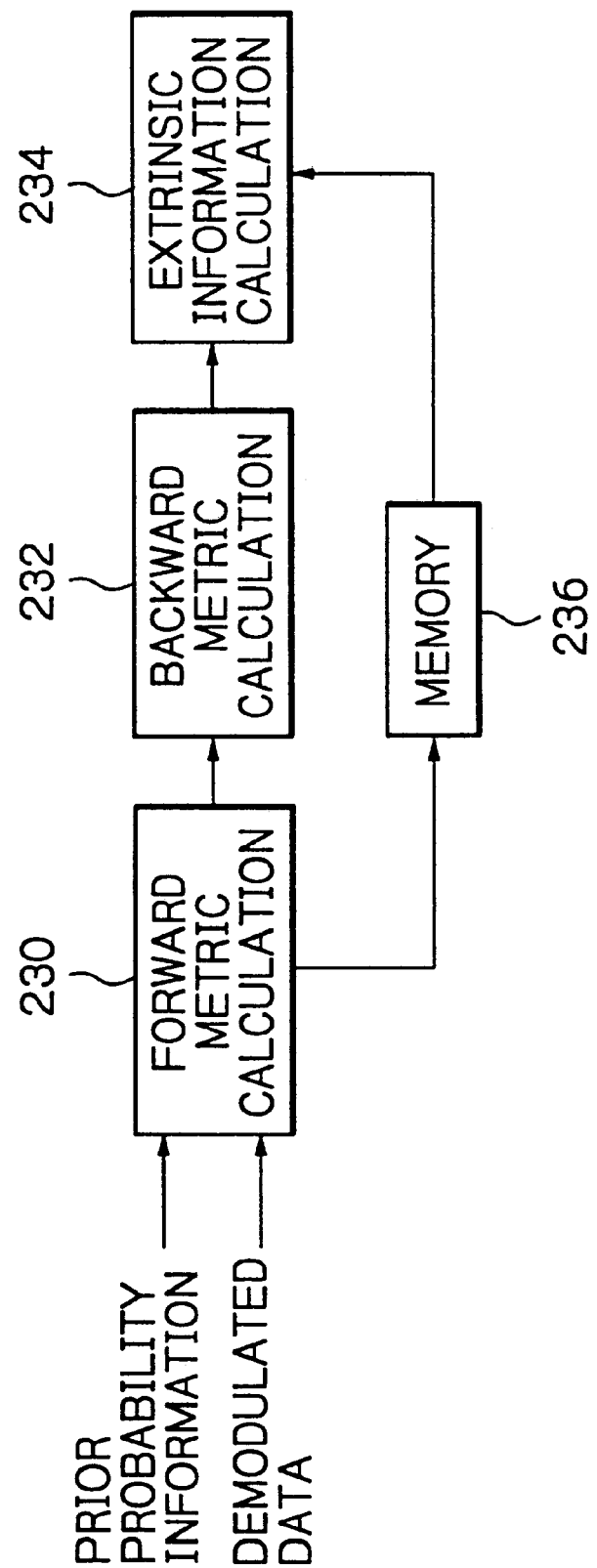
FIG. 6 illustrates the function of the SISO decoders in FIG. 5.

As shown in FIG. 6, MAP decoding is classified roughly into three stages: forward metric calculation 230, backward metric calculation 232, and extrinsic information calculation 234. The forward metric calculation 230 and the backward metric calculation 232 calculate, for each bit (data bit) of the input data sequence, the metric (probability of state m at time t) of state of memories within element encoder (for example, element encoder 102 in FIG. 2). The forward metric calculation 230 calculates the transition of each state metric for each bit in order of data bit entry. The backward metric calculation 232 calculates the transition of each state metric for each bit in reverse order of data bit entry.

For example, when the memory size of the element encoder is three (constraint length is four), there are eight kinds of state (2×2×2=8) because the state of each memory is 0 or 1. The state metric is calculated for each of these eight states. In this case, the state metric is calculated by the previously-calculated state metric and the branch metric (probability at which data bit i is received at time t and in state m) obtained by the data bits at that time. Therefore, when the number of data units in an encoded frame is N, (8×N) state metrics are calculated. In addition, when the encoder performs termination processing for a encoded frame, the calculation for the termination processing is added.

The extrinsic information calculation 234 calculates the likelihood ratio (ratio of posteriori probability at which the data bit is 1 to posteriori probability at which the data bit is 0) and the extrinsic information for each data bit, using the forward state metric and the backward state metric calculated by the forward metric calculation 230 and backward metric calculation 232, respectively, and the branch metric. In this case, because the likelihood ratio and the extrinsic information must be calculated using the forward state metric and the backward state metric for the same data bit, the forward state metric calculated previously by the forward metric calculation 230 must be stored temporarily in a memory 236 during MAP decoding shown in FIG. 6. When the backward state metric is calculated before the forward metric, the backward state metric is stored temporarily in the memory 236.

Figure 7:
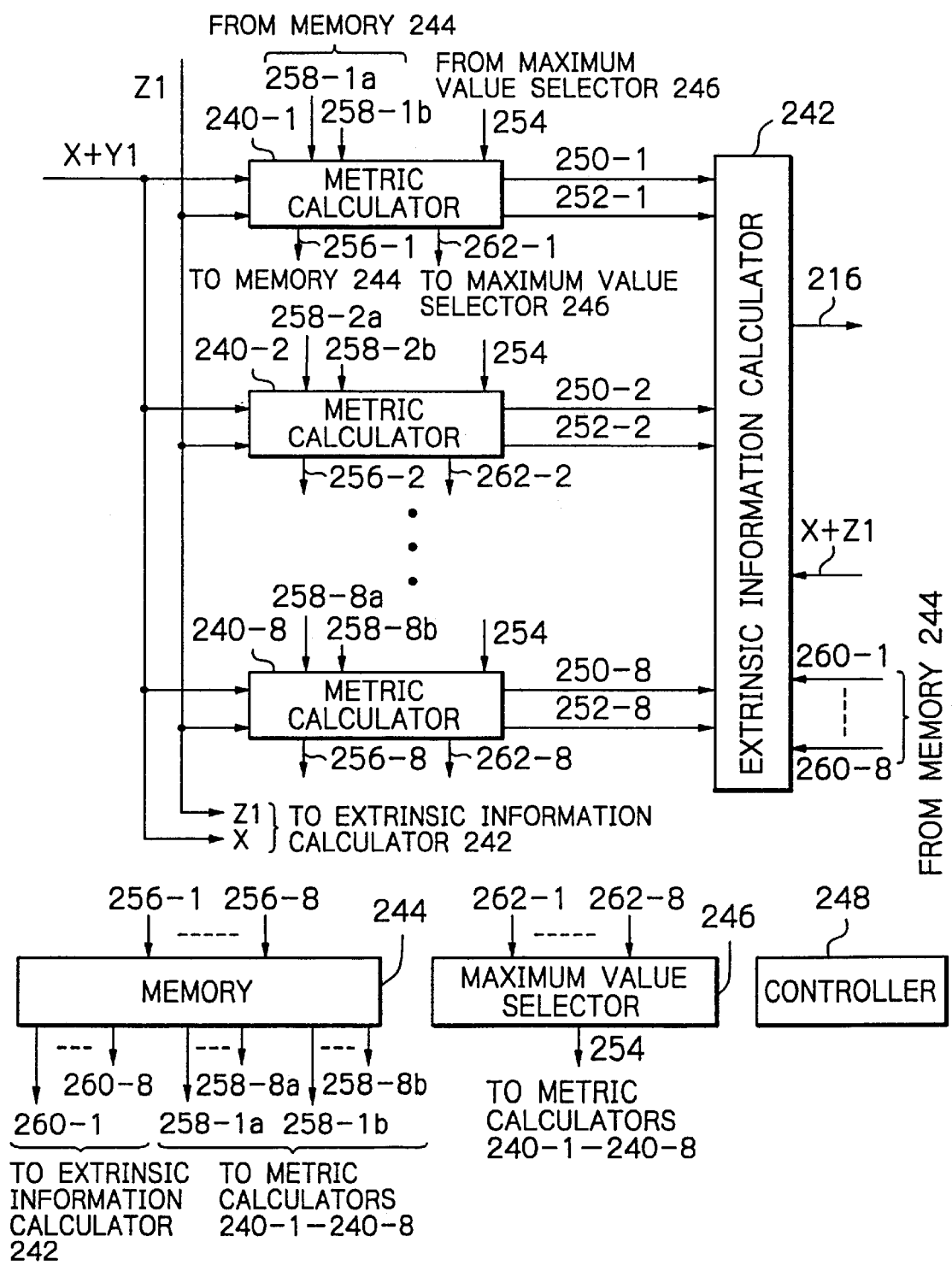
FIG. 7 is a block diagram showing an embodiment of the SISO decoder in FIG. 5.

As described above, the SISO decoders 200 and 206 have the functions of the forward metric calculation 230, backward metric calculation 232, and extrinsic information calculation 234 shown in FIG. 6. FIG. 7 is a diagram showing an embodiment of the SISO decoder 200 in which memory size of the element decoder is three (constraint length is four). The configuration of the SISO decoder 206 is the same as that of the SISO decoder 200. As shown in FIG. 7, the SISO decoder 200 comprises eight metric calculators 240-1–240-8 each of which calculates the state metric, an extrinsic information calculator 242 which calculates the extrinsic information, a memory 244 which temporarily stores therein the calculated state metric, a maximum value selector 246, and a controller 248 which controls the components.

The metric calculators 240-1–240-8 are calculators calculating the state metric corresponding to states m1–m8. For example, the metric calculator 240-1 generates addition values 250-1 and 252-1 which will be described later and state metrics 256-1 and 262-1, based on the data X and coded data Y1 which are input from external and prior probability information Z1 which is generated by the SISO decoder 206 and input via the de-interleaver 208. The calculator 240-1 outputs the generated addition values 250-1 and 252-1 to the extrinsic information calculator 242, outputs the state metric 256-1 to the memory 244, and outputs the state metric 262-1 to the maximum value selector 246.

The metric calculator 240-1 uses state metrics 258-1a and 258-1b supplied from the memory 244 to generate the addition values 250-1 and 252-1, uses an addition value 254-1 supplied from the maximum value selector 246 to generate the state metric 262-1, and uses a state metric 254 output from the maximum value selector 246 to generate the state metric 256-1. Each configuration of other metric calculators 240-2–240-8 is the same as that of the metric calculator 240-1.

The extrinsic information calculator 242 generates the soft-decision output, based on the addition values 250-1–250-8 and 252-1–252-8 output by the metric calculators 240-1–240-8 and on the state metrics 260-1–260-8 supplied from the memory 244. It also generates the extrinsic information 216 based on the soft-decision output. To generate this extrinsic information 216, the data X and the prior probability information Z1 are used.

The memory 244, a memory in which state metrics are stored under control of the controller 248, stores therein state metrics 256-1–256-8 output from the metric calculators 240-1–240-8, reads the state metrics 258-1a–258-8a and 258-1b–258-8b from the stored state metrics to output them to the metric calculators 240-1–240-8 and, in addition, reads state metrics 260-1–260-8, which will be described later, and outputs them to the extrinsic information calculator 242.

The maximum value selector 246 reads the state metrics 262-1–262-8 output from the metric calculators 240-1–240-8, selects the maximum state metric, and outputs it to the metric calculators 240-1–240-8 as the state metric 254. The controller 248 generates the control signal for writing state metrics into, or reading state metrics from, the memory 244 to supply it to the memory 244 and, at the same time, generates timing signals and control signals and supplies them to the components of the decoder.

Figure 8:
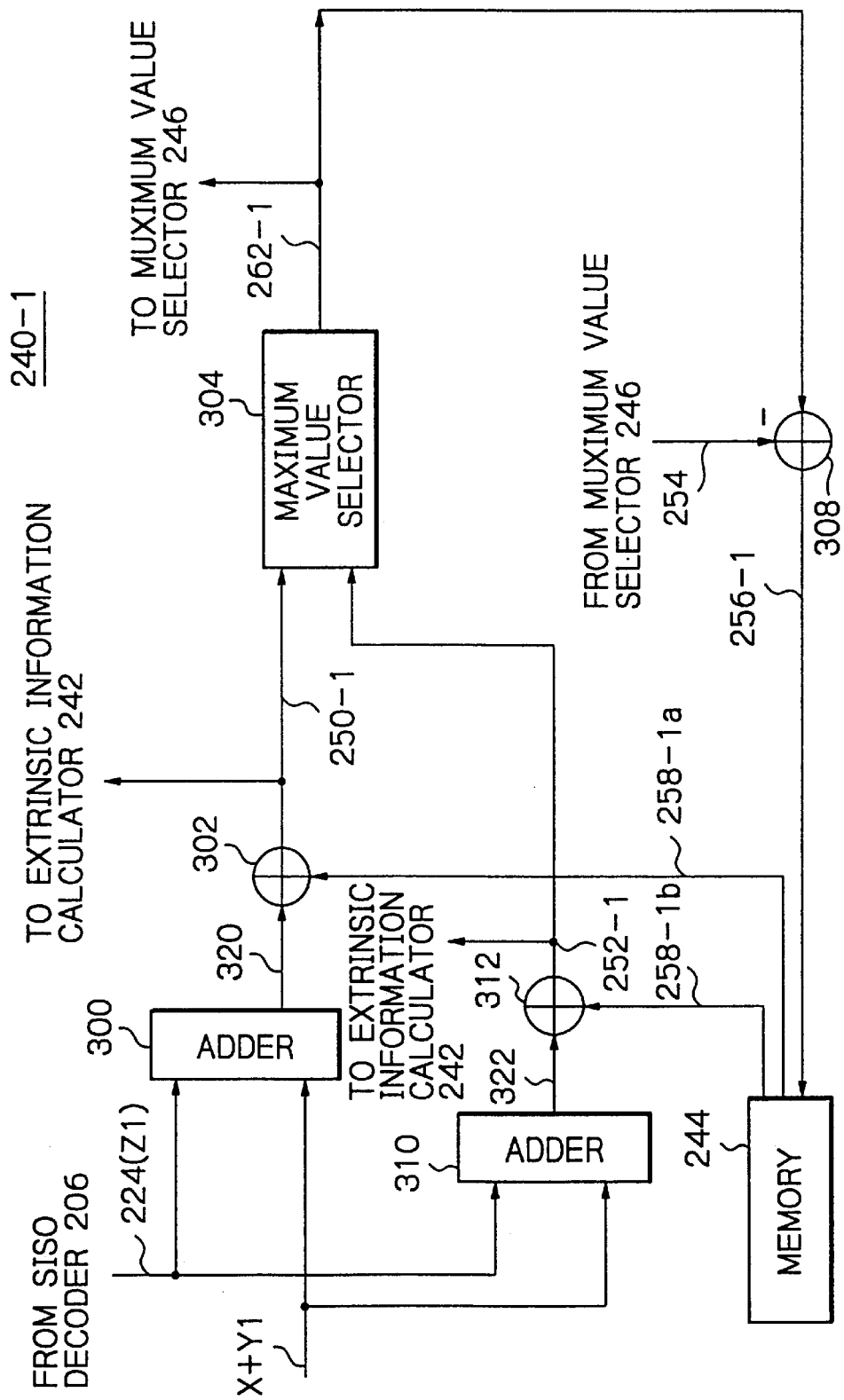
FIG. 8 is a block diagram showing an embodiment of a metric calculator included in the SISO decoder in FIG. 5.

The embodiments of the metric calculators 240-1–240-8 will be described in detail. The metric calculator 240-1 will be described as an example because the configurations of the metric calculators 240-1–240-8 are the same each other. As shown in FIG. 8, she metric calculator 240-1 comprises adders 300, 302, 310, and 312, maximum value selector 304, and a normalizer 308. The memory 244 is the memory 244 shown in FIG. 7.

The demodulated data X, coded data Y1, and prior probability information Z1 generated by the other SISO decoder 206 are input to the adders 300 and 310. When a forward state metric is calculated, the data X and the coded data Y1 are sequentially input to the adders, one bit at a time, beginning with the start of each encoded frame. When a backward state metric is calculated, they are sequentially input to the adders, one bit at a time, beginning with the end of each encoded frame. A memory in which the data is stored is provided, although not shown in the figure to prevent the figure from becoming complicated.

The adders 300 and 310 add up the data X, coded data Y1, and prior probability information Z1 to generate branch metrics 320 and 322. The adder 300 generates the branch metric 320 when the data bit of the data X is assumed to be 1. The adder 310 generates the branch metric 322 when the data bit of the data X is assumed to be 0. The states of the branch metrics 320 and 322 depend on the states of the state metrics to be calculated. The adder 300 generates the branch metric 320 when the data bit of the data X is assumed to be 1 while the adder 310 generates the branch metric 322 when the data bit of the data X is assumed to be 0. More specifically, at time k, let $x_k$ be the data X, let $y_k$ be the coded data Y1, let $z_k$ be the prior probability of data bit i (i=1, 0), and let $p^{i,m}$ be the coded parity bit when the data in the state m is i. Then, the branch metric $D_k^{i,m}$ of receiving data i (i=1, 0) in the state m is expressed by expression (1) shown below.

$$D_k^{i,m} = C_k + z_k + L_c x_k i + L_c y_k p^{i,m} \tag{1}$$

where $C_k$ and $L_c$ are constants. The adder 300 generates the branch metric 320 according to expression (1) for each data bit, and the adder 310 generates the branch metric 322 according to expression (1) for each data bit.

The adder 302 is connected to the adder 300, and the adder 312 is connected to the adder 310. The adder 302 adds up the branch metric 320 output from the adder 300 and the state metric 258-1a read from the memory 244. The adder 312 adds up the branch metric 322 output from the adder 310 and the state metric 258-1b read from the memory 244. The state metrics 258-1a and 258-1b are the state metrics calculated when the previous data bit was input. The controller 248 reads these metrics from the memory 244 and supplies them to the adders 302 and 312.

The extrinsic information calculator 242 shown in FIG. 7 is connected to the adders 302 and 312. The addition value 250-1 generated by the adders 302 and 312 when the data bit is 1 and the addition value 252-1 generated when the data bit is 0, are sent to the extrinsic information calculator 242. In addition, the maximum value selector 304 is connected to the adders 302 and 312. The maximum value selector 304 compares the addition value 250-1 output from the adder 302 with the addition value 252-1 output from the adder 312, selects the larger, and outputs it as the state metric 262-1.

The state metric is represented by the sum of the logarithm of the addition value when the data bit i is 1 and the logarithm of the addition value when the data bit i is 0. However, the sub-log MAP algorithm performs approximate calculation by selecting the larger or the smaller of the addition value for simplifying calculation. The maximum value selector 304 in this embodiment selects the larger addition value and uses it as the state metric 262-1.

The normalizer 308 is connected to the maximum value selector 304. The normalizer 308 is a subtracter which subtracts the state metric 254 output from the maximum value selector 246 shown in FIG. 7 from the state metric 262-1 output from the maximum value selector 304 and outputs the resulting value as the state metric 256-1. This allows the state metric 256-1 to be normalized by the largest state metric 254, suppresses data expansion, and therefore prevents a calculation overflow.

The memory 244 is connected to the normalizer 308. As shown in FIG. 7, the memory 244 temporarily stores into the memory area the state metrics 256-1–256-8 output from the metric calculators 240-1–240-8 under control of the controller 248. The state metrics stored in the memory 244 are read as the state metrics 258-1a–258-8a and 258-1b–258-8b when the state metric for the next data bit is calculated. These state metrics are supplied to the metric calculators 240-1–240-8. When the state metrics 256-1–256-8 are already calculated, they are stored in the memory 244 for each data bit, read when the extrinsic information is calculated, and supplied to the extrinsic information calculator 242.

Figure 10:
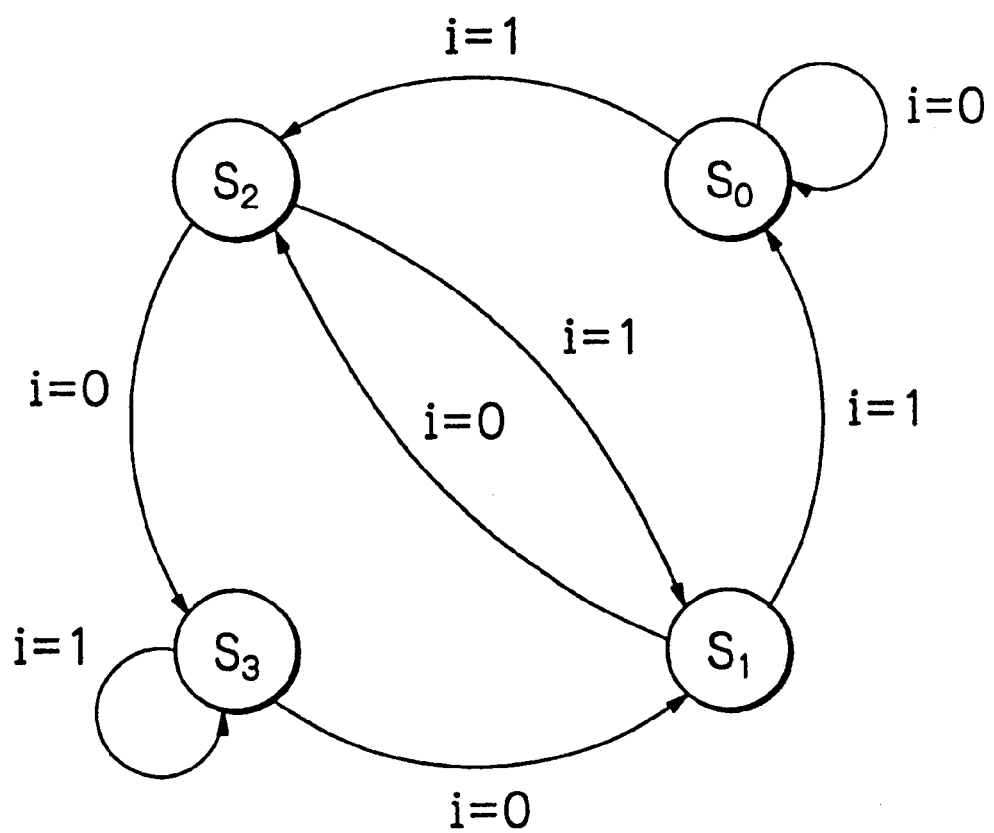
FIG. 10 shows an example of state transition in a memory of a constituent encoder.

The states of the state metrics 258-1a and 258-1b supplied to the adder 302 and 312 described above are determined by the state of the state metric 262-1 (m1 in this case) to be calculated. For example, to make the figure simple, consider the state transition of memory with the size of 2 (constraint length is 3). FIG. 10 shows its state transition. In FIG. 10, take state 0 ($S_0$) for example. When the input data i is 0, the state transits from state 0 to state 0 and, when input data i is 1, the state transits from state 0 to state 2 ($S_2$). The state transits to state 0 from state 0 or from state 1 ($S_1$) depending upon whether the input data i is 0 or 1.

Take state 1 ($S_1$) for example. When the input data i is 0, the state transits from state 1 to state 2 and, when the input data i is 1, the state transits from state 1 to state 0. The state transits to state 1 from state 3 ($S_3$) or from state 2 depending upon whether the input data i is 0 or 1. The same applies to state 2 and state 3. As described above, the state transition is predetermined. The controller 248 reads the state metrics 258-1a–258-8a and 258-1b–258-8b of the predetermined states from the memory 244 according to the state transition when the memory size is 3 (constraint length 4) to supply them to the metric calculators 240-1 to 240-8. It then informs the adders 300 and 310 in the metric calculators 240-1–240-8 of the states of the branch metrics 320 and 322 to be calculated.

Figure 9:
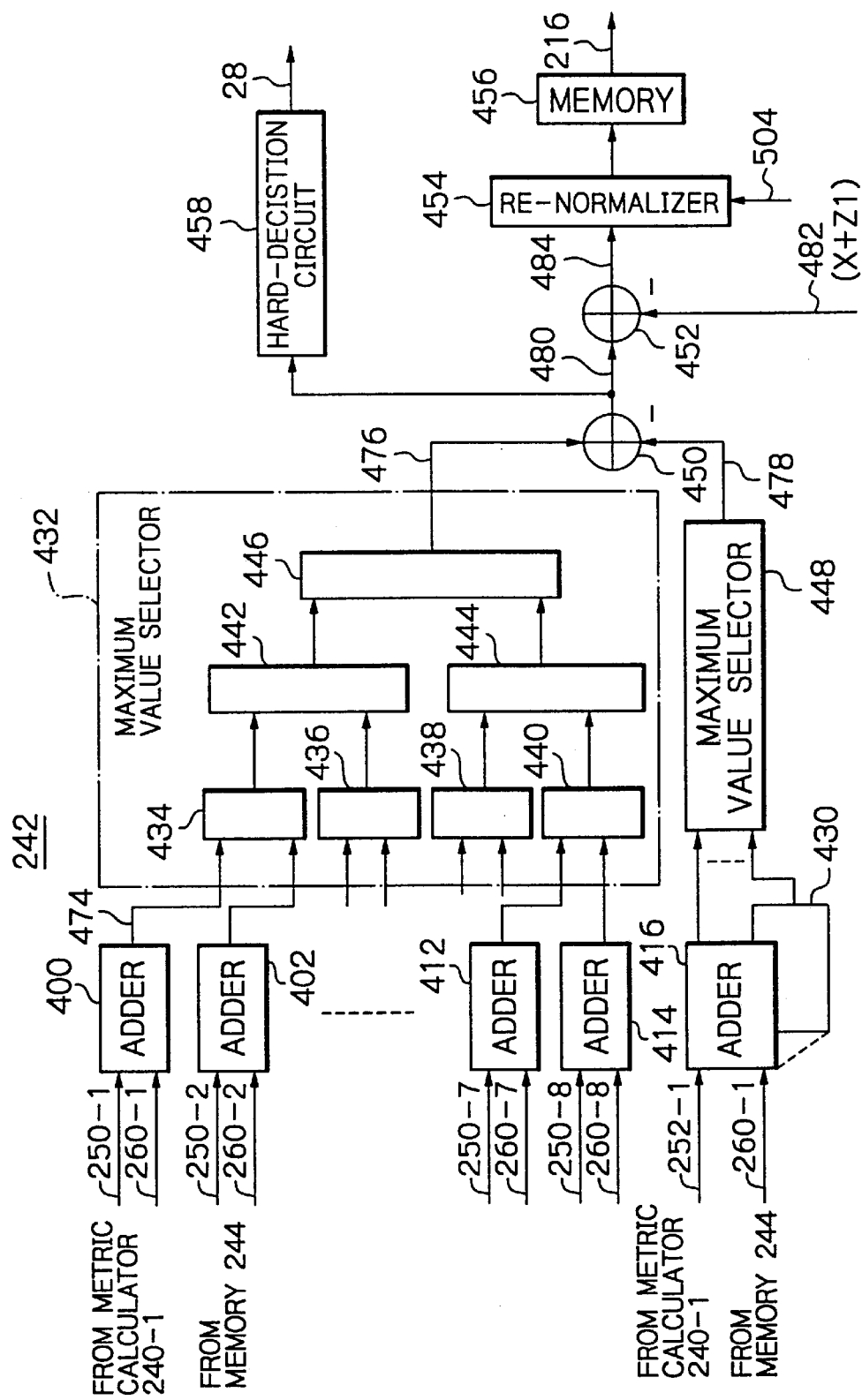
FIG. 9 shows an embodiment of an extrinsic information calculator included in the SISO decoder in FIG. 5.

Next, an embodiment of the extrinsic information calculator 242 shown in FIG. 7 will be described with reference to FIG. 9. The extrinsic information calculator 242 calculates the likelihood ratio (in this embodiment, the ratio is defined as the ratio of posteriori probability at which the data bit is 1 to posteriori probability at which the data bit is 0), outputs the calculated ratio as the soft-decision output and, at the same time, finds the extrinsic information from the calculated likelihood ratio. As shown in FIG. 9, the calculator 242 comprises 16 adders 400–430, maximum value selectors 432 and 448, subtracters 450 and 452, re-normalizer 454, memory 456, and hard-decision circuit 458. In some cases, the memory 456 need not be provided independently but a part of the memory 244 may be used.

The adders 400–414 and the maximum value selector 432 constitute a likelihood calculator for calculating the likelihood when the data bit is 1. The adders 416–430 and the maximum value selector 448 constitute a likelihood calculator for calculating the likelihood when the data bit is 0. The addition value 250-1 output from the metric calculator 240-1 and the state metric 260-1 read from the memory 244 are input to the adder 400. If the state of the addition value 250-1 is mc, then the state metric 260-1 takes the state which has transited at the time t=k+1 from the state mc in response to the data bit i input at the time t=k. Similarly, the addition values 250-2–250-8 output from the metric calculators 240-2–240-8 and the state metrics 260-2–260-8 read from the memory 244 are input to the adders 402–414, respectively.

On the other hand, the addition value 252-1 output from the metric calculator 240-1 and the state metric 260-1 read from the memory 244 are input to the adder 416. Similarly, the addition values 252-2–252-8 output from the metric calculators 240-2–240-8 and the state metrics 260-2–260-8 read from the memory 244 are input to the adders 418–430.

The adders 400–430 add up the input addition value and the state metric for each data bit. For example, the adder 400 adds up the addition value 250-1 and the state metric 260-1. The maximum value selector 432 is connected to the adders 400–430, while the maximum value selector 448 is connected to the adders 416–430. The addition values generated by the adders 400–414 are input to the maximum value selector 432, while the addition values generated by the adders 416–430 are input to the maximum value selector 448.

In this embodiment, the maximum value selector 432 comprises seven maximum value selection circuits 434–446 each of which selects the maximum value from two inputs. It selects the maximum value from the addition values input from the adders 400–414 and outputs the selected maximum value as a likelihood 476 when the data bit is 1. The likelihood is usually represented as the sum of the logarithms of the addition values input from the adders 400–414. In this embodiment, however, an approximate value obtained by selecting the largest addition value from the addition values of the states is used as the likelihood to simplify the calculation. The maximum value selector 448, similar in configuration to the maximum value selector 432, selects the largest addition value from the addition values output from the adders 416–430, and outputs the selected value as a likelihood 478 when the data bit is 0.

The outputs 476 and 478 of the maximum value selectors 432 and 448 are connected to the subtracter 450. The subtracter 450 subtracts, for each data bit, the likelihood 478 output from the maximum value selector 448 from the likelihood 476 output from the maximum value selector 432 and generates a likelihood ratio 480 which is the soft-decision output after error correction. The subtracter 452 and the hard-decision circuit 458 are connected to the subtracter 450.

The subtracter 452 subtracts, for each data bit, data 482 from the likelihood ratio 480 output from the subtracter 450 and generates extrinsic information 484. The data 482 is composed of the data X and the prior probability information Z1. The data X and the prior probability information Z1 are the same as the data X and the prior probability information Z1 input to the metric calculators 240-1–240-8. Because the likelihood ratio 480 is represented by the sum of the prior probability information Z1, data X, and extrinsic information 484, the extrinsic information 484 is obtained by subtracting the prior probability information Z1 and the data X from the likelihood ratio 480 generated by the subtracter 450.

The re-normalizer 454 is connected to the subtracter 452. In the prior art, the extrinsic information 484 generated by the subtracter 452 is stored temporarily in the memory 456 for use as the prior probability information 216 for the next iterative decoding. However, in the decoder according to the present invention, the re-normalizer 454 is provided on the output side of the subtracter 452. This re-normalizer multiplies the extrinsic information 484 by a predetermined value to execute re-normalization. The resulting value is stored temporarily in the memory 456. Re-normalizing the extrinsic information 484 reduces the errors generated during approximation in the circuitry such as the maximum value selector 304 shown in FIG. 8 and the maximum value selectors 432 and 448 shown in FIG. 9, thus increasing error correction decoding performance.

Figure 11:
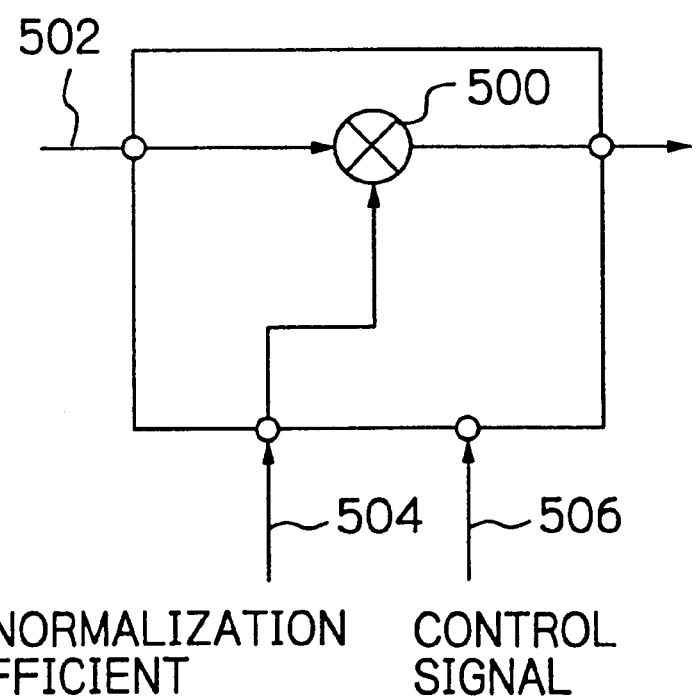
FIG. 11 is a block diagram showing an embodiment of a re-normalizer included in the extrinsic information calculator in FIG. 9.

FIG. 11 shows an embodiment of the re-normalizer 454. This re-normalizer 454 includes a multiplier 500, which multiplies the extrinsic information 484 by a re-normalization coefficient 504. The re-normalization coefficient 504 and a control signal 506 are supplied from the controller 248, and the multiplying operation is controlled by the control signal 506. The value of the re-normalization coefficient 504 is set by the controller 248 so that error correction decoding performance is increased. For example, the value of re-normalization, coefficient 504 is (a) constant throughout iterative decoding, (b) varied according to the iteration count, (c) varied according to the code rate, or (d) varied for each data bit. These methods are appropriately combined to reduce errors generated during approximation and to increase error correction decoding performance.

The above-described metric calculators 240-1–240-8 and the extrinsic information calculator 242 are implemented by hardware devices such as LSI circuits (Large Scale Integrated Circuit), FPGA (Field Programmable Gate Array), and DSP (Digital Signal Processor). However, they are not limited to these types of hardware.

Next, the operation of the metric calculator 240-1 shown in FIG. 8 and the extrinsic information calculator 242 shown in FIG. 9 will be described. In this example, the calculation of backward state metrics is followed by the calculation of forward state metrics. During backward metric calculation, the data X and the encoded data Y1 are input sequentially, one bit at a time, to the adders 300 and 310, shown in FIG. 8, beginning with the last bit of a frame for each coded frame. At the same time, the prior probability information Z1 generated by the other SISO decoder 206 is input to the adders 300 and 310 via the de-interleaver 208.

The adder 300 adds up, for each data bit, the data X, encoded data Y1, and prior probability information Z1 according to the expression shown in (1) generates the branch metric 320 when the data bit is 1, and outputs it to the adder 302. The adder 310 adds up, for each data bit, the data X. encoded data Y1, and prior probability information Z1 according to the expression shown in (1), generates the branch metric 322 when the data bit is 0, and outputs it to the adder 312. At this time, the states of the branch metrics 320 and 322 are indicated by the controller 248. On the other hand, from the memory 244, the predetermined backward state metrics 258-1a and 258-1b, which are state metrics previously stored under control of the controller 248, are read and are supplied to the adders 302 and 312, respectively.

The adder 302 adds up, for each data bit, the branch metric 320 and the backward state metric 258-1a and outputs the addition value 250-1 to the maximum value selector 304. The adder 312 adds up, for each data bit, the branch metric 322 and the backward state metric 258-1b and outputs the addition value 252-1 to the maximum value selector 304. The maximum value selector 304 compares the received addition value 250-1 with the addition value 252-1, selects the larger, and outputs it to the normalizer 308 as the backward state metric 262-1. The backward state metric 262-1 is output to the maximum value selector 246 shown in FIG. 7.

The normalizer 308 subtracts the backward state metric 254, supplied from the maximum value selector 246 shown in FIG. 7, from the backward state metric 262-1 to normalize the backward state metric 262-1. The normalizer 308 then outputs the normalized state metric to the memory 244 as the backward state metric 256-1 and stores it there for each state. When the backward state metric is calculated, a predetermined backward state metric is read from the backward state metrics stored in the memory 244 and is supplied to the adders 302 and 312 as the backward state metrics 258-1a and 258-1b. After one encoded frame is processed, the backward state metric calculated for each data bit of one encoded frame is stored in the memory 244 for each of eight states (m1–m8).

After calculating the backward state metric, the metric calculator 240-1 calculates the forward state metric for each bit of the same encoded frame. When the forward metric is calculated, the data X and the coded data Y1 are input sequentially to the adders 300 and 310, one bit at a time, from the start of the frame. At the same time, the prior probability information Z1 generated by the other iterative error correction decoders 206 is input via the de-interleaver 208. The metric calculator 240-1 calculates, for each data bit, the forward state metric the same way it calculates the backward state metric. In this case, the addition values 250-1 and 252-1 generated by the adders 302 and 312 are output to the extrinsic information calculator 242 shown in FIG. 9.

Next, with reference to FIG. 9, the operation of the extrinsic information calculator 242 will be described. To the adders 400–414, the addition values 250-1–250-8 output from the metric calculators 240-1–240-8 and the backward state metrics 260-1–260-8 read from the memory 244 are input, respectively. For example, the adder 400 adds up the addition value 250-1 and the backward state metric 260-1 and outputs the resulting value to the maximum value selector 432. Other adders 402–414 also add up the addition value and the backward metric and outputs the resulting value to the maximum value selector 432.

The adders 416-430 receive the addition values 252-1–252-8 output from the metric calculators 240-1–240-8 and the backward state metrics 260-1–260-8 read from the memory 244. The backward state metrics 260-1–260-8 that are input to the adders 416–430 are the same backward state metrics 260-1–260-8 input to the adders 400–414. The adders 416–430 each add up the input addition value and the backward state metric and output the resulting value to the maximum value selector 448.

The maximum value selector 432 selects the maximum value from the addition values output from the adders 400–414 and outputs the selected value to the subtracter 450 as the likelihood 476 when the data bit is 1. The maximum value selector 448 selects the maximum value from the addition values output from the adders 416–430 and outputs the selected value to the subtracter 450 as the likelihood 478 when the data bit is 0. The subtracter 450 subtracts the likelihood 478 from the likelihood 476 to generate the likelihood ratio 480 and outputs it to the subtracter 452 and the hard-decision circuit 458.

The subtracter 452 subtracts the data 482 from the input likelihood ratio 480 to generate the extrinsic information 484 and outputs it to the re-normalizer 454. The re-normalizer 454 multiplies the extrinsic information 484 by the re-normalization coefficient 504 supplied from the controller 248 to re-normalize the extrinsic information 484 and temporarily stores it in the memory 456. The extrinsic information stored in the memory 456 is used as the prior probability information 216 for the next iterative decoding. The hard-decision circuit 458 of the extrinsic information calculator 242 in the SISO decoder 206 checks whether the data is 1 or 0 based on the likelihood ratio 480 output from the subtracter 450, and outputs the decoded data 28.

As described above, the metric calculators 240-1–240-8 shown in FIG. 7 generate the backward state metric, the forward state metric, and so on, for each state and for each data bit. The extrinsic information calculator 124 generates, for each data bit, extrinsic information which will be used as the prior probability information in the next iterative decoding In this case, the decoder in this embodiment has the re-normalizer 454 which re-normalizes the generated extrinsic information, thus reducing errors generated during approximation calculation and increasing error correction decoding performance.

Figure 12:
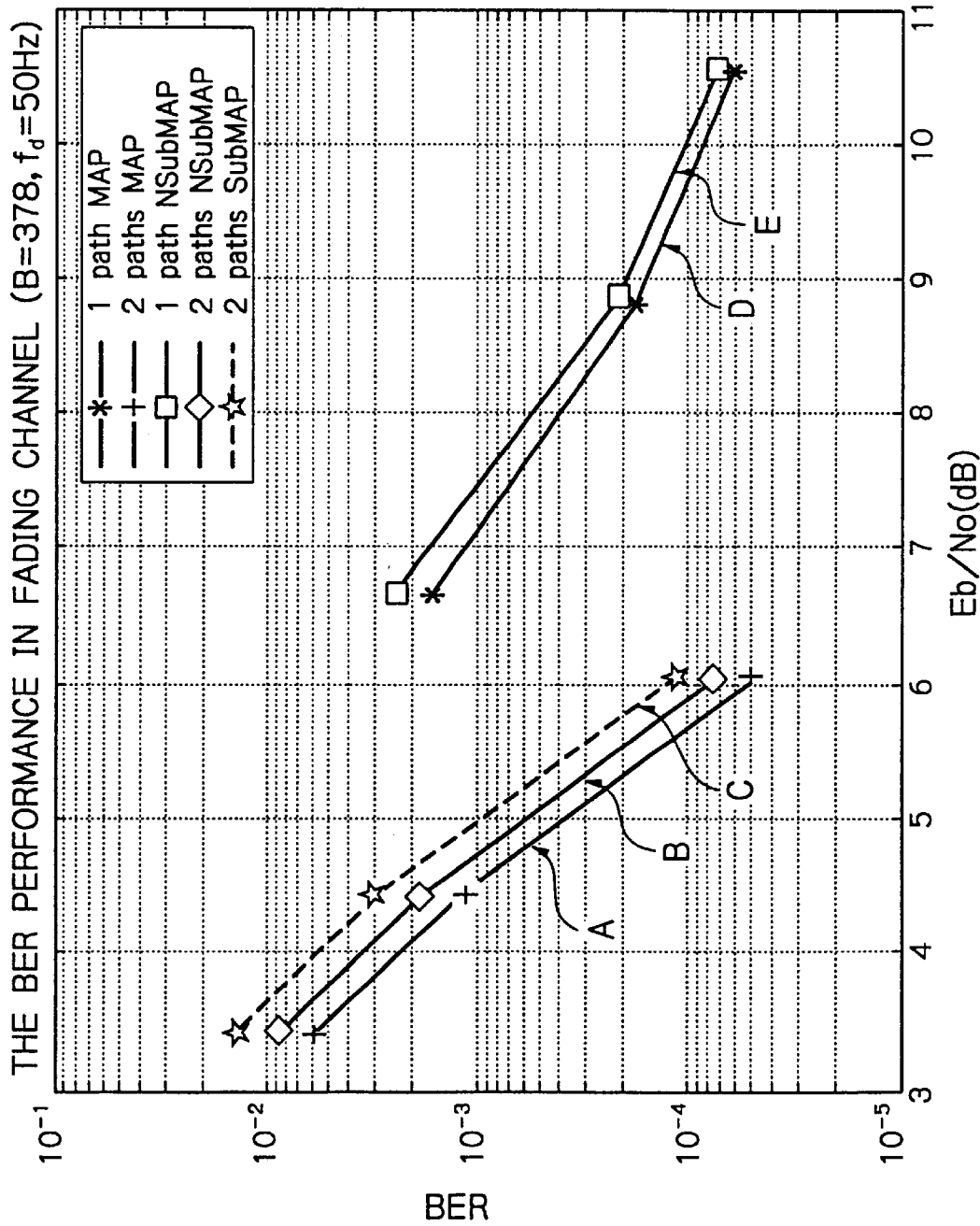
FIG. 12 shows the verification result, through simulation, of the effect of the normalizer in FIG. 11 in the fading environment.
Figure 13:
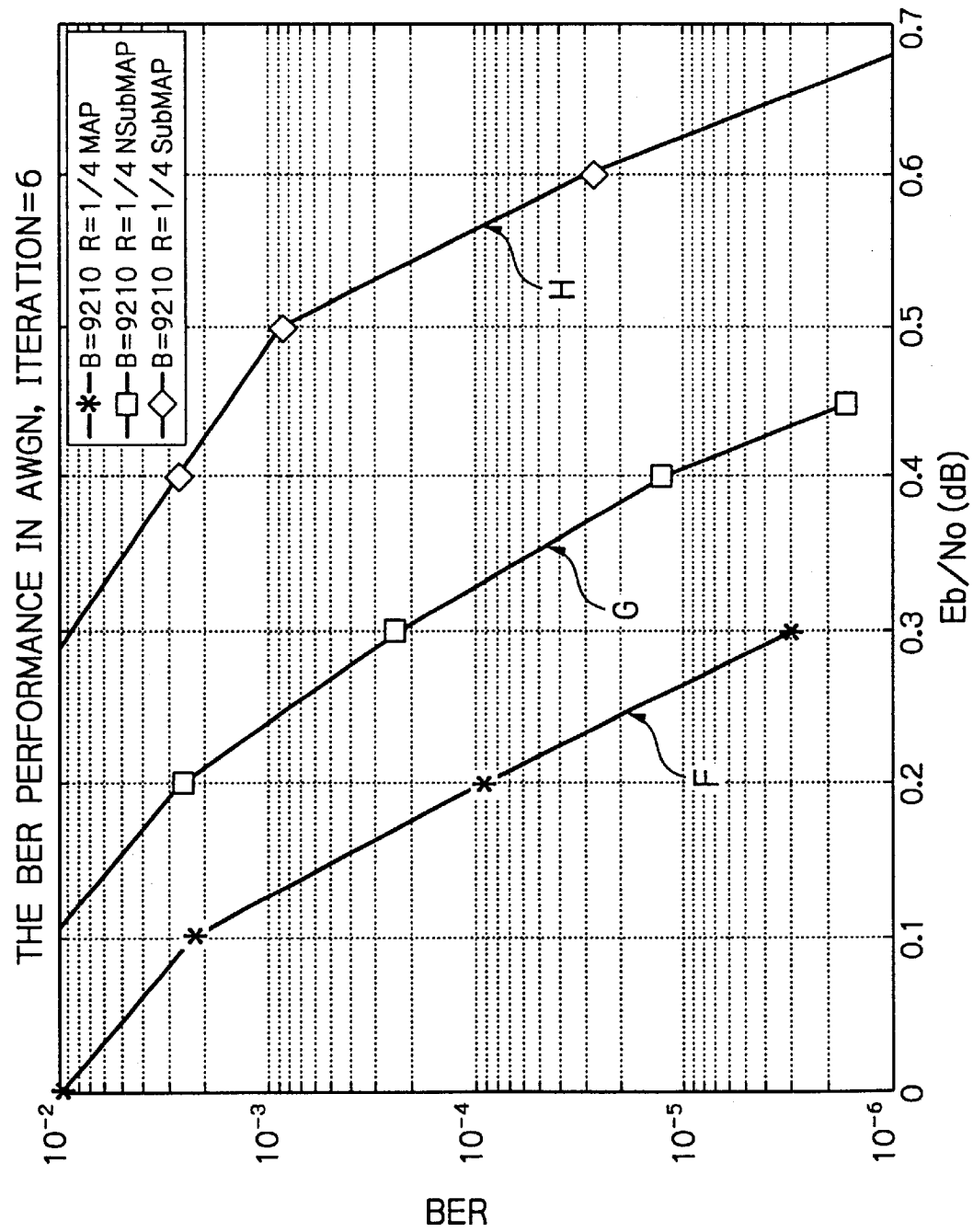
FIG. 13 shows the verification result, through simulation, of the effect of the normalizer in FIG. 11 in the AWGN environment.

FIGS. 12 and 13 show the re-normalization effect of the re-normalizer 454 which has been verified through simulation. FIG. 12 shows the effect of re-normalization in the fading environment. For a 2-path map, the difference in BER (Bit Error Rate) between the sub MAP decoding algorithm (indicated by C) and the MAP decoding algorithm (indicated by A) is about 0.35 dB. This difference in BER is reduced to less than 0.1 dB by the re-normalization performed by the re-normalizer 454 (indicated by B). For a 1-path map, re-normalization performed by the re-normalizer 454 also reduces the difference in BER between the sub MAP decoding algorithm (indicated by E) and the MAP decoding algorithm (indicated by D) to less than 0.1 dB. FIG. 13 shows the re-normalization effect in the AWGN (Additive White Gaussian Noise) environment. The figure shows that the BER of the sub MAP decoding algorithm (indicated by H) is improved by the re-normalization (indicated by G) performed by the re-normalizer 454 (F indicates MAP decoding).

In the embodiment, the SISO decoder using sub-log MAP algorithm was described above. The present invention applies also to an SISO decoder using the log MAP algorithm. The present invention may apply not only to iterative error correction decoding through PCCC but also to iterative error correction decoding through SCCC (Serial Concatenated Convolutional Code), HCCC (Hybrid Concatenated Convolutional Code), or a code such as turbo block code using log MAP or sub-log MAP.

Figure 14:
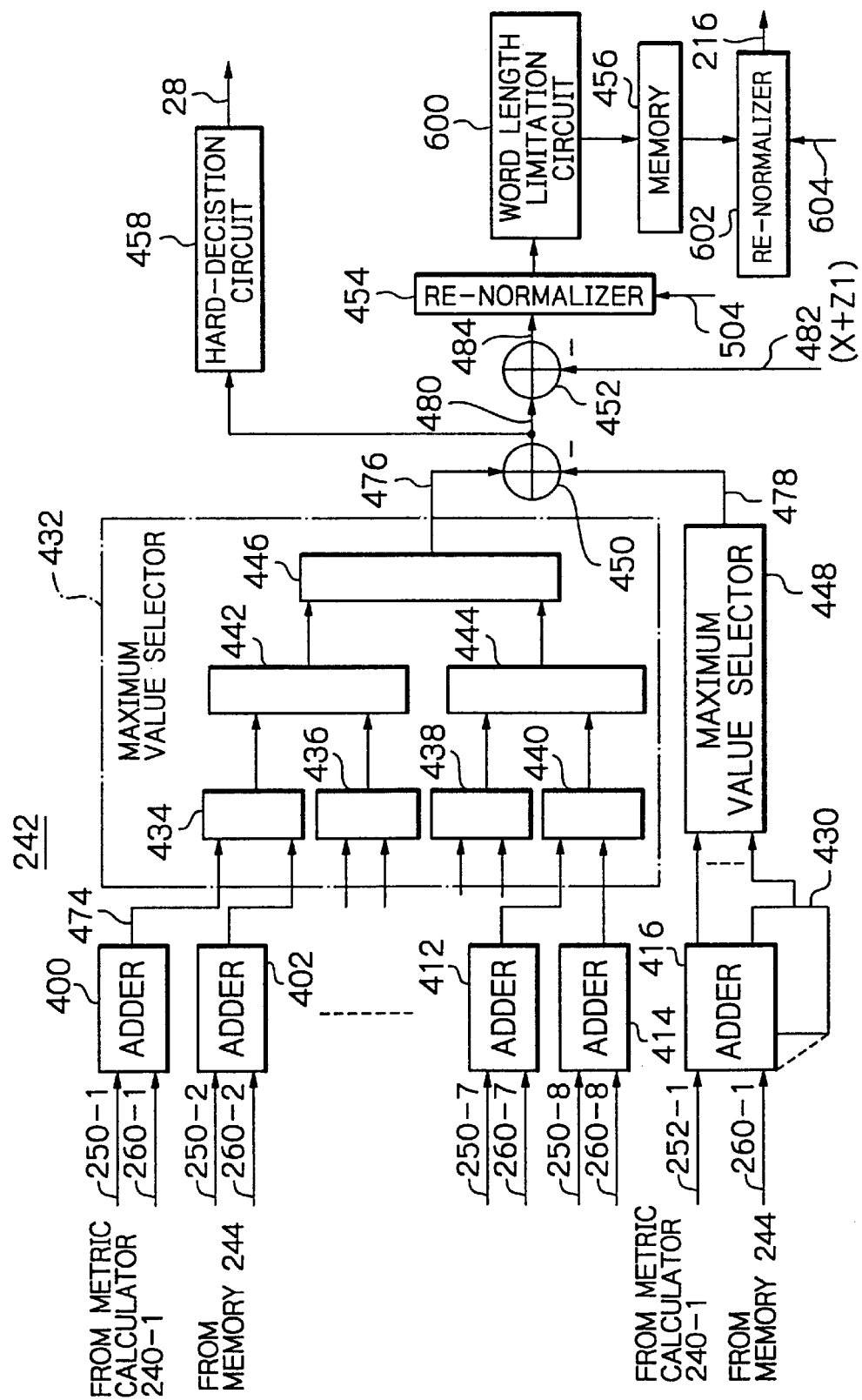
FIG. 14 is a block diagram showing an alternative embodiment of the extrinsic information calculator according to the present invention.

FIG. 14 shows another embodiment of the present invention. The extrinsic information calculator in this embodiment differs from the extrinsic information calculator 242, shown in FIG. 9, in that the memory 456 has a word length limitation circuit 600 on the input side and a re-normalizer 602 on the output side. This configuration limits the word length of extrinsic information stored in the memory 456 and reduces the memory capacity. The re-normalizer 602, similar in configuration to the re-normalizer 454, receives a re-normalization coefficient 604 from the controller 248. The operation of this embodiment will be described with reference to FIG. 15. The description of the operation executed before the extrinsic information 484 is generated, which is the same as that of the extrinsic information calculator 242 shown in FIG. 9, is omitted.

Figure 15:
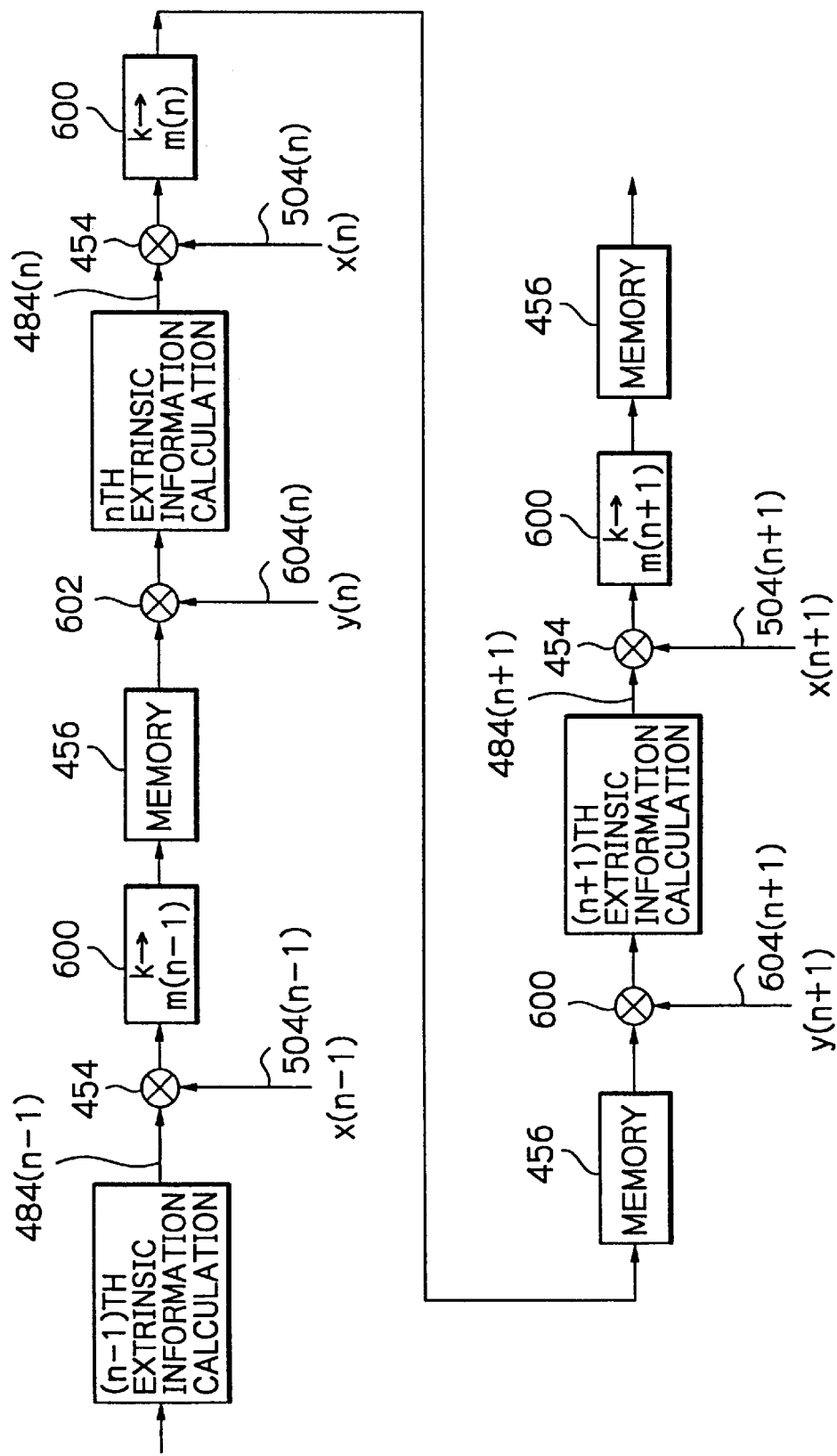
FIG. 15 shows the operation of the extrinsic information calculator shown in FIG. 14.

Referring to FIG. 15, the extrinsic information 484 (n−1) generated by the (n−1)-th iterative decoding is input to the re-normalizer 454. The extrinsic information 484(n−1) is multiplied by the re-normalization coefficient 504 (n−1) with the value of x(n−1). The resulting extrinsic information is input to the word length limitation circuit 600 to limit the word length from k bits to m(n−1) bits and is stored in the memory 456. When the extrinsic information 484 is stored in the memory 456 in this manner, the word length is limited from k bits to m(n−1) bits. Thus, the capacity of the memory 456 may be reduced. The extrinsic information stored in the memory 456 is read when the next nth iterative decoding is performed and is input to the re-normalizer 602. The extrinsic information input to the re-normalizer 602 is multiplied by the re-normalization coefficient 604 (n) with the value of y(n) for use in the nth interactive decoding.

The extrinsic information 484 (n) generated by the nth iterative decoding is input to the re-normalizer 454, and is multiplied by the re-normalization coefficient 504 (n) with the value of x(n). The extrinsic information is then input to the word length limitation circuit 600 to limit the word length from k bits to m(n) bits and is stored in the memory 456. Normally, the m(n) bits are set so that the number of bits is equal to that of the previous m(n−1) bits. In this embodiment, when limiting the word length from k bits to m(n) bits, the optimum extrinsic information is selected by changing the bit extraction position for extracting m(n) bits from k bits.

In addition, the extrinsic information stored in the memory 456 is read when the (n+1)-th iterative decoding is performed and is input to the re-normalizer 602. The extrinsic information input to the re-normalizer 602 is multiplied by the re-normalization coefficient 604 (n+1) with the value of y (n+1) for use in the (n+1)-th iterative decoding. The extrinsic information 484(n+1) generated by the (n+1)-th iterative decoding is input to the re-normalizer 454, and is multiplied by the re-normalization coefficient 504(n+1) with the value of x(n+1). The extrinsic information is then input to the word length limitation circuit 600, the word length is limited from k bits to m(n+1) bits, and the extrinsic information is stored in the memory 456. Again, in this case, the m(n+1) bits are set so that the number of bits is equal to that of the previous m(n−1) bits and that of the m(n) bits. Therefore, the word length of the extrinsic information stored in the memory 456 remains unchanged. However, the bit extraction position for extracting the bits from k bits is set to ensure optimum decoding performance.

Figure 16:
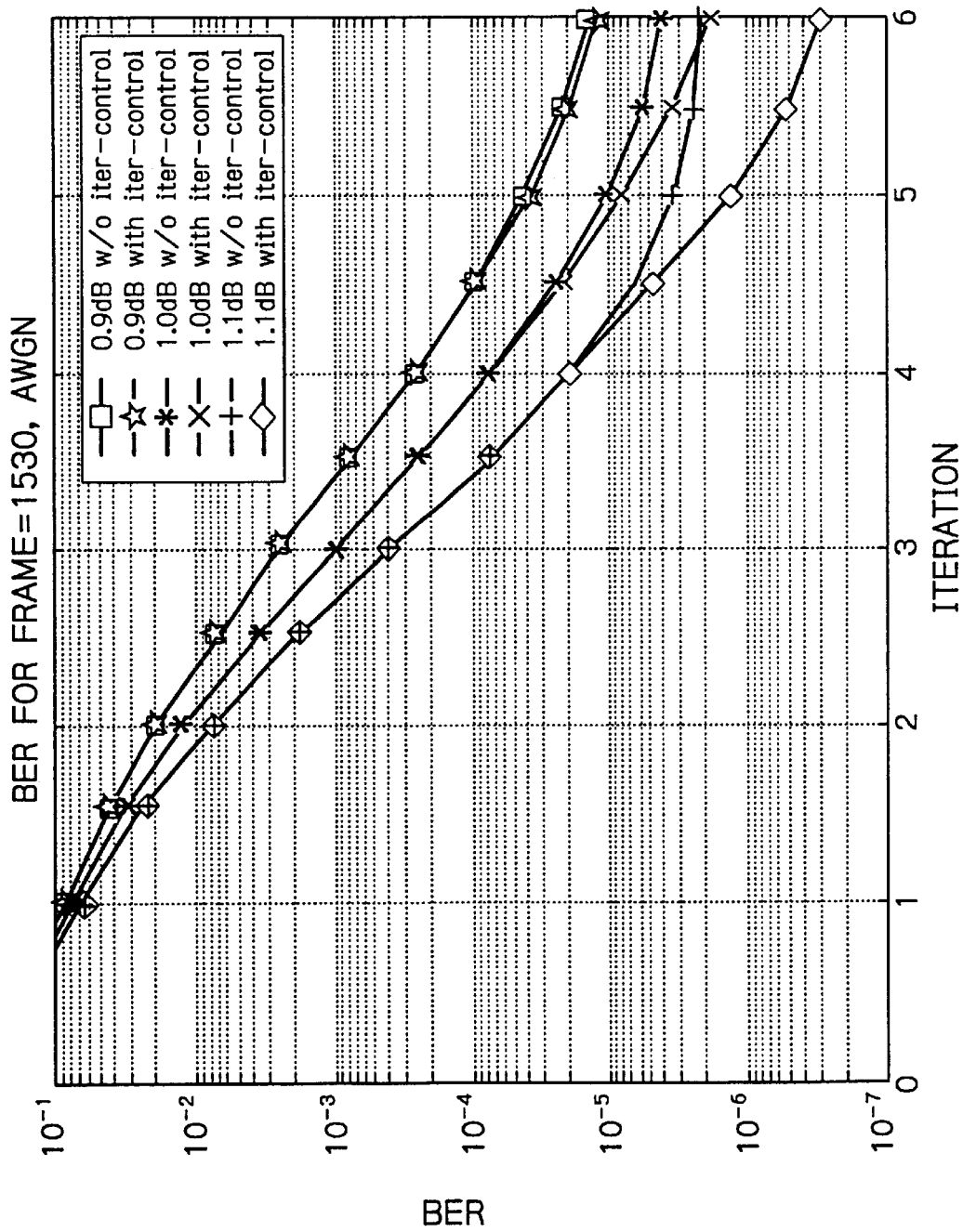
FIG. 16 shows the verification result, through simulation, of the effect obtained by the extrinsic information calculator in FIG. 14.
Figure 17:
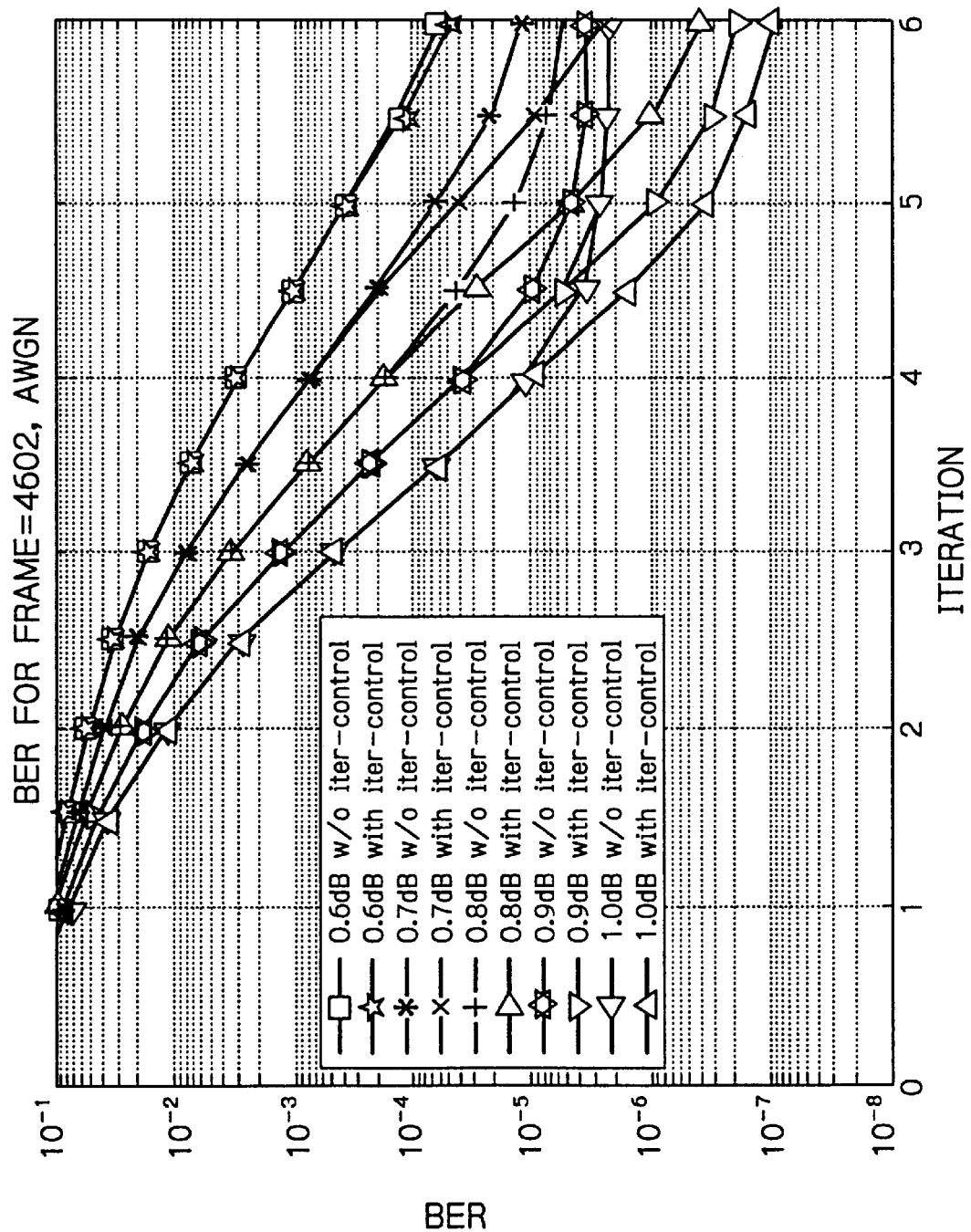
FIG. 17 shows the verification result, through simulation, of the effect obtained by the extrinsic information calculator in FIG. 14.

FIGS. 16 and 17 show the effect of this embodiment verified through simulation. FIGS. 16 and 17, both of which show the simulation result in the AWGN environment, indicate that the attenuation of the iteration effect is reduced by the iteration control.

As described above, this embodiment limits the word length (number of bits) of the extrinsic information to reduce the memory capacity. At the same time, when limiting the word length of the extrinsic information, the embodiment changes the bit extraction position for each iterative decoding to maintain decoding performance. In addition, when the extrinsic information is read from memory for iterative decoding, the embodiment multiplies the extrinsic information by a predetermined re-normalization coefficient, thus increasing memory utilization and decoding performance.

The decoder according to the present invention multiplies the extrinsic information, which is generated during iterative decoding and is stored in memory temporarily for use as the prior probability information in the next decoding, by a predetermined coefficient for re-normalization. This reduces errors generated during sub-log MAP approximation and increases the performance of error correction decoding.

In addition, when storing the extrinsic information into memory, the decoder according to the present invention limits the word length (number of bits) of the extrinsic information to reduce the memory usage amount. At the same time, when limiting the word length of the extrinsic information, the decoder changes the bit extraction position for each iterative decoding to maintain decoding performance.

While the present invention has been described with reference to the particular illustrative embodiments, it is not to be restricted by those embodiments. It is to be appreciated that those skilled in the art can change or modify the embodiments without departing from the scope and spirit of the present invention.

What is claimed is:

1. An SISO (Soft In Soft Out) decoder comprising:
a plurality of metric calculators each generating a forward state metric and a backward state metric of a predetermined state for each data bit of each encoded frame;
an extrinsic information calculator generating extrinsic information based on the forward state metric and the backward state metric; and
a memory for storing the forward state metric and the backward state metric,
wherein each of said plurality of metric calculators comprises:
a first adder generating a branch metric when the data bit is 1, based on received data, coded data, and prior probability information, and adding the state metric, which is supplied from said memory, to the branch metric to generate an addition value;
a second adder generating a branch metric when the data bit is 0, based on the received data, coded data, and prior probability information, and adding the state metric, which is supplied from said memory, to the branch metric to generate an addition value; and
a first maximum value selector selecting the larger of the addition value generated by said first adder and the addition value generated by said second adder to generate the state metric,
wherein said extrinsic information calculator comprises:
a second maximum value selector adding the state metric, supplied from said memory, to each addition value generated when the forward state metric or the backward state metric, whichever is generated later, is generated by the first adder of each of said plurality of metric calculators, and selecting a largest addition value to generate a likelihood when the data bit is 1;
a third maximum value selector adding the state metric, supplied from said memory, to each addition value generated when the forward state metric or the backward state metric, whichever is generated later, is generated by the second adder of each of said plurality of metric calculators, and selecting a largest addition value to generate a likelihood when the data bit is 0;
a first subtracter subtracting the likelihood generated by said third maximum value selector from the likelihood generated by said second maximum value selector to generate a likelihood ratio;
a second subtracter subtracting the data and the prior probability information from the likelihood ratio generated by said first subtracter; and
a re-normalizer multiplying to the extrinsic information generated by said second subtracter by a re-normalization coefficient to normalize the extrinsic information, and
wherein said memory temporarily stores therein the state metrics calculated by said plurality of metric calculators, reads the state metric of each state metric therefrom when the state metric of a next data bit is generated, outputs the state metric to the first adder and the second adder of a predetermined metric calculator and, at the same time, stores the forward state metric or the backward state metric which is generated by each of said plurality of metric calculators and whichever is generated earlier and outputs the state metric to the second maximum value selector and the third maximum value selector of said extrinsic information calculator.

2. The SISO decoder according to claim 1 wherein the re-normalizer of said extrinsic information calculator maintains the re-normalization coefficient at a constant value for at least all iterative decoding.

3. The SISO decoder according to claim 1 wherein the re-normalizer of said extrinsic information calculator changes the re-normalization coefficient at least according to a number of times iterative decoding is executed.

4. The SISO decoder according to claim 1 wherein the re-normalizer of said extrinsic information calculator changes the re-normalization coefficient at least according to an encoding rate of an input signal.

5. The SISO decoder according to claim 1 wherein the re-normalizer of said extrinsic information calculator changes the re-normalization coefficient at least for each data bit of an input signal.

6. An SISO decoder comprising:
a plurality of metric calculators each generating a forward state metric and a backward state metric of a predetermined state for each data bit of each encoded frame;
an extrinsic information calculator generating extrinsic information based on the forward state metric and the backward state metric; and
a memory for storing the forward state metric and the backward state metric,
wherein each of said plurality of metric calculators comprises:
a first adder generating a branch metric when the data bit is 1, based on received data, coded data, and prior probability information, and adding the state metric, which is supplied from said memory, to the branch metric to generate an addition value;
a second adder generating a branch metric when the data bit is 0, based on the received data, coded data, and prior probability information, and adding the state metric, which is supplied from said memory, to the branch metric to generate an addition value; and a first maximum value selector selecting the larger of the addition value generated by said first adder and the addition value generated by said second adder to generate the state metric, wherein said extrinsic information calculator comprises:

a second maximum value selector adding the state metric, supplied from said memory, to each addition value generated when the forward state metric or the backward state metric, whichever is generated later, is generated by the first adder of each of said plurality of metric calculators, and selecting a largest addition value to generate a likelihood when the data bit is 1;

a third maximum value selector adding the state metric, supplied from said memory, to each addition value generated when the forward state metric or the backward state metric, whichever is generated later, is generated by the second adder of each of said plurality of metric calculators, and selecting a largest addition value to generate a likelihood when the data bit is 0;

a first subtracter subtracting the likelihood generated by said third maximum value selector from the likelihood generated by said second maximum value selector to generate a likelihood ratio;

a second subtracter subtracting the data and the prior probability information from the likelihood ratio generated by said first subtracter;

a first re-normalizer multiplying the extrinsic information generated by said second subtracter by a re-normalization coefficient to normalize the extrinsic information, a word length limitation circuit limiting a number of bits of the extrinsic information normalized by said first re-normalizer while changing a bit extraction position according to the number of Limes iterative decoding is executed;

a memory circuit accumulating therein the extrinsic information whose word length is limited by said word length limitation circuit; and a second re-normalizer multiplying the extrinsic information read from the memory circuit by another re-normalization coefficient to normalize the extrinsic information, and wherein said memory temporarily stores therein the state metrics calculated by said plurality of metric calculators, reads the state metric of each state metric therefrom when the state metric of a next data bit is generated, outputs the state metric to the first adder and the second adder of a predetermined metric calculator and, at the same time, stores the forward state metric or the backward state metric which is generated by each of said plurality of metric calculators and whichever is generated earlier and outputs the state metric to the second maximum value selector and the third maximum value selector of said extrinsic information calculator.

7. The SISO decoder according to claim 6 wherein the first re-normalizer and the second re-normalizer of said extrinsic information calculator maintain the re-normalization coefficient at a constant value for at least all iterative decoding.

8. The SISO decoder according to claim 6 wherein the first re-normalizer and the second re-normalizer of said extrinsic information calculator changes the re-normalization coefficient at least according to a number of times iterative decoding is executed.

9. The SISO decoder according to claim 6 wherein the first re-normalizer and the second re-normalizer of said extrinsic information calculator changes the re-normalization coefficient at least according to an encoding rate of an input signal.

10. The SISO decoder according to claim 6 wherein the first re-normalizer and the second re-normalizer of said extrinsic information calculator changes the re-normalization coefficient at least for each data bit of an input signal.

* * * * *